United States Patent [19]
Sato

[11] Patent Number: 5,854,796
[45] Date of Patent: Dec. 29, 1998

[54] METHOD OF AND APPARATUS FOR TESTING SEMICONDUCTOR MEMORY

[75] Inventor: Shinya Sato, Tokyo, Japan

[73] Assignee: Advantest Corporation, Tokyo, Japan

[21] Appl. No.: 861,344

[22] Filed: May 21, 1997

[30] Foreign Application Priority Data

May 29, 1996 [JP] Japan .................................. 8-135207

[51] Int. Cl.⁶ .................................................. G06F 11/00
[52] U.S. Cl. ............................................................ 371/21.1
[58] Field of Search ................................ 371/21.1, 21.2, 371/21.4, 21.5, 21.6; 365/201

[56] References Cited

U.S. PATENT DOCUMENTS 5,173,906  12/1992  Dreubelbis et al. ................... 371/22.5

Primary Examiner—Vincent P. Canney
Attorney, Agent, or Firm—Knobbe, Martens Olson &Bear, LLP

[57] ABSTRACT

A failure analysis memory for storing failure information representative of a test result of a semiconductor memory under test is divided into a plurality of blocks with compacted addresses, and a compaction memory having areas corresponding respectively to the blocks of the failure analysis memory is prepared. Data indicative of a failure cell in any one of the blocks of the failure analysis memory is written in an area of the compaction memory which corresponds to the any one of the blocks. Minimum and maximum addresses of addresses at which failure cells are present in the blocks are determined, and failure data is read from the failure analysis memory in a range between the minimum and maximum addresses of each of the blocks, which correspond to the areas of the compaction memory which store the data indicative of a failure cell.

3 Claims, 10 Drawing Sheets

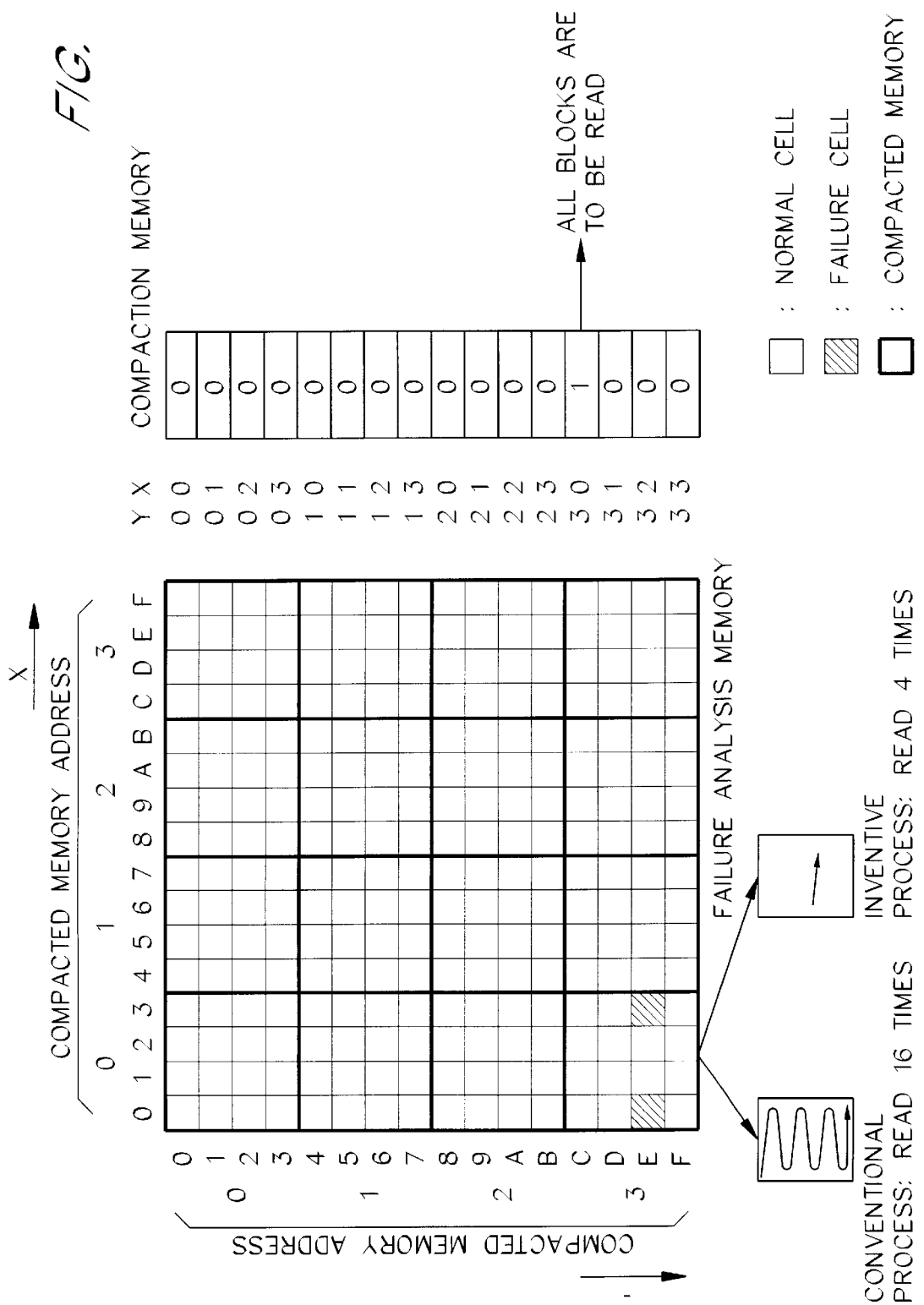

METHOD OF AND APPARATUS FOR TESTING SEMICONDUCTOR MEMORY

BACKGROUND OF THE INVENTION

1. Field of the Invention

The present invention relates to a method of and an apparatus for testing a semiconductor memory.

2. Description of the Related Art

FIG. 1 of the accompanying drawings shows in block form a conventional semiconductor memory testing apparatus. As shown in FIG. 1, the conventional semiconductor memory testing apparatus comprises a timing generator 51, a pattern generator 52, a failure analysis memory 53, a waveform shaper 54, and a logic comparator 55, for testing a semiconductor memory 56.

The timing generator 51 generates a reference clock signal. Based on the reference clock signal generated by the timing generator 51, the pattern generator 52 generates an address signal, test data, and a control signal to be applied to the semiconductor memory 56 under test. The pattern generator 52 also outputs an address to the failure analysis memory 53, and also outputs expected value data to the logic comparator 55. The address signal, the test data, and the control signal are supplied to the waveform shaper 54, which shapes the waveforms of the address signal, the test data, and the control signal into waveforms required to test the semiconductor memory 56, and applies the address signal, the test data, and the control signal which have the respective required waveforms to the semiconductor memory 56 under test. The semiconductor memory 56 under test is controlled to write and read the test data by the control signal. The test data read from the semiconductor memory 56 under test is supplied to the logic comparator 55, and compared thereby with the expected value data outputted from the pattern generator 52. It is determined whether the semiconductor memory 56 under test is good or not depending on whether the test data agrees with the expected value data or not. If the test data does not agree with the expected value data, then failure data "1" from the logic comparator 55 is stored in the failure analysis memory 53.

Details of the failure analysis memory 53 are shown in FIG. 2 of the accompanying drawings. As shown in FIG. 2, the failure analysis memory 53 comprises an address selector 61, a memory controller 62, and a memory unit 63. The address selector 61 divides the address signal from the pattern generator 52 into a high-order address and a low-order address. The high-order address is outputted to the memory controller 62, and the low-order address is outputted to the memory unit 63. There are as many memory units 63 as the number of high-order addresses. When failure data is outputted from the logic comparator 55, the memory controller 62 outputs a write signal to the memory unit 63 which is represented by the high-order address, for thereby storing the failure data of the semiconductor memory 56 under test into the memory unit 63. After the test, the contents of the failure analysis memory 53 are checked to analyze failure addresses of the semiconductor memory 56 under test.

One conventional process of reading failure data from a failure analysis memory at a high speed uses a compaction memory. The compaction memory is a memory for storing failure data with certain address areas compacted. If there is even one failure cell in a compacted address area (block), then data "1" is stored in the compaction memory.

FIG. 3 of the accompanying drawings shows an example of the failure analysis memory and the compaction memory.

As shown in FIG. 3, one block of the failure analysis memory is divided into 4×4 blocks each comprising 4×4 cells, and the compaction memory comprises 16 areas corresponding to X and Y addresses in each of the blocks of the failure analysis memory. Each of the areas of the compaction memory stores data "1" if there is even one failure cell in the corresponding block of the failure analysis memory.

In the example shown in FIG. 3, since failure cells are present in the blocks (0, 0), (1, 1), (2, 1), (2, 2) of the failure analysis memory, the data "1" is written in each of the corresponding areas of the compaction memory. The data "1" stored in the compaction memory are read, and the data in only those blocks of the failure analysis memory which correspond to the areas of the compaction memory where the data "1" are stored are read. In this manner, the number of times that the data stored in the failure analysis memory is read is reduced, thus speeding up the process of reading the data from the failure analysis memory.

However, even if one failure cell is present in a block of the failure analysis memory, all failure information in the block is read from the failure analysis memory. Therefore, if failure cells are present in all blocks of the failure analysis memory, all the blocks of the failure analysis memory have to be read. Accordingly, the number of times that the data stored in the failure analysis memory is read is increased, thus slowing the process of reading the data from the failure analysis memory.

As DRAMs or the like as the semiconductor memory under test come to have greater storage capacities, the storage capacity of each of the blocks of the failure analysis memory also becomes larger. Even if the data stored in the compaction memory used in connection with the failure analysis memory represent a few failure blocks in the failure analysis memory, it is time-consuming to read the data from the failure blocks of the failure analysis memory. If the storage capacity of each of the blocks of the failure analysis memory is reduced, then the storage capacity of the compaction memory is increased. Therefore, it is time-consuming to read the data from the compaction memory, resulting in a long overall readout time required to test the semiconductor memory.

SUMMARY OF THE INVENTION

It is therefore an object of the present invention to provide a method of and an apparatus for testing a semiconductor memory while reading failure data from a failure analysis memory at a higher speed.

To achieve the above object, there is provided in accordance with the present invention a method of testing a semiconductor memory, comprising the steps of dividing a failure analysis memory for storing failure information representative of a test result of a semiconductor memory under test, into a plurality of blocks with compacted addresses, preparing a compaction memory having areas corresponding respectively to the blocks of the failure analysis memory, writing data indicative of a failure cell in any one of the blocks of the failure analysis memory, in an area of the compaction memory which corresponds to the any one of the blocks, determining minimum and maximum addresses of addresses at which failure cells are present in the blocks, and reading failure data from the failure analysis memory in a range between the minimum and maximum addresses of each of the blocks, which correspond to the areas of the compaction memory which store the data indicative of a failure cell.

According to the present invention, there is also provided an apparatus for testing a semiconductor memory, comprising a failure analysis memory divided into a plurality of blocks with compacted addresses for storing failure information representative of a test result of a semiconductor memory under test, a compaction memory having areas corresponding respectively to the blocks of the failure analysis memory, data writing means for writing data indicative of a failure cell in any one of the blocks of the failure analysis memory, in an area of the compaction memory which corresponds to the any one of the blocks, minimum address storing means and maximum address storing means for storing a minimum address and a maximum address, respectively, of addresses at which failure cells are present in the blocks, first and second address comparing means for comparing a readout address of each of the blocks of the failure analysis memory with the minimum address stored in the minimum address storing means and the maximum address stored in the maximum address storing means, means for storing the readout address in the minimum address storing means if the readout address is smaller than the minimum address and failure data of the failure analysis memory at the readout address represents a failure address, means for storing the readout address in the maximum address storing means if the readout address is greater than the maximum address and failure data of the failure analysis memory at the readout address represents a failure address, and means for reading failure data from the failure analysis memory in a range between the minimum and maximum addresses of each of the blocks, which are stored in the minimum and maximum address storing means.

With the arrangement of the present invention, minimum and maximum addresses of addresses at which a failure cell is present in a compacted block are found in a semiconductor memory test, and failure data is read only between the minimum and maximum addresses in the block for thereby reducing the number of times that failure blocks are read and hence speeding up the process of reading the failure blocks.

According to a conventional process, if a failure analysis memory contains failure cells in a block as shown in FIG. 10 of the accompanying drawings, then it is necessary to read the block 16 times in order to read failure data at all addresses of the block from the failure analysis memory. This is because the failure data is address-compacted, failing to tell how many failure cells and where failure cells are present in the block. In order to obtain accurate information of failure cells in the block, all failure data are read at compacted addresses in the block from the failure analysis memory. To solve the above problem, according to the present invention, it is ascertained where failure cells are present in the block. Rather than reading failure data at all addresses in the block, only addresses at which failure cells are present are read, thereby reducing the number of times that the block is read. Inasmuch as all addresses of failure cells in failure blocks cannot be stored because it would require as much hardware as the failure analysis memory, minimum and maximum addresses of failure cells in blocks are found, and failure data at addresses between the minimum and maximum addresses are read. In the example of FIG. 10, since failure cells are present at addresses Y-#E, X-#0 (hereinafter referred to as #E0), #E3, the addresses #E0, #E3 are used as minimum and maximum addresses, and data are read in a range between these minimum and maximum addresses from the failure analysis memory. While it has heretofore been necessary to read the block 16 times, it is sufficient to read the block 4 times according to the present invention. Therefore, the process of reading the failure analysis memory is speeded up.

The above and other objects, features, and advantages of the present invention will become apparent from the following description with reference to the accompanying drawings which illustrate examples of the present invention.

BRIEF DESCRIPTION OF THE DRAWINGS

FIG. 10 is a diagram showing another example of data stored in an address-compacted failure analysis memory and a compaction memory, the view illustrating the principles of the present invention.

DETAILED DESCRIPTION OF THE PREFERRED EMBODIMENT

Figure 1:
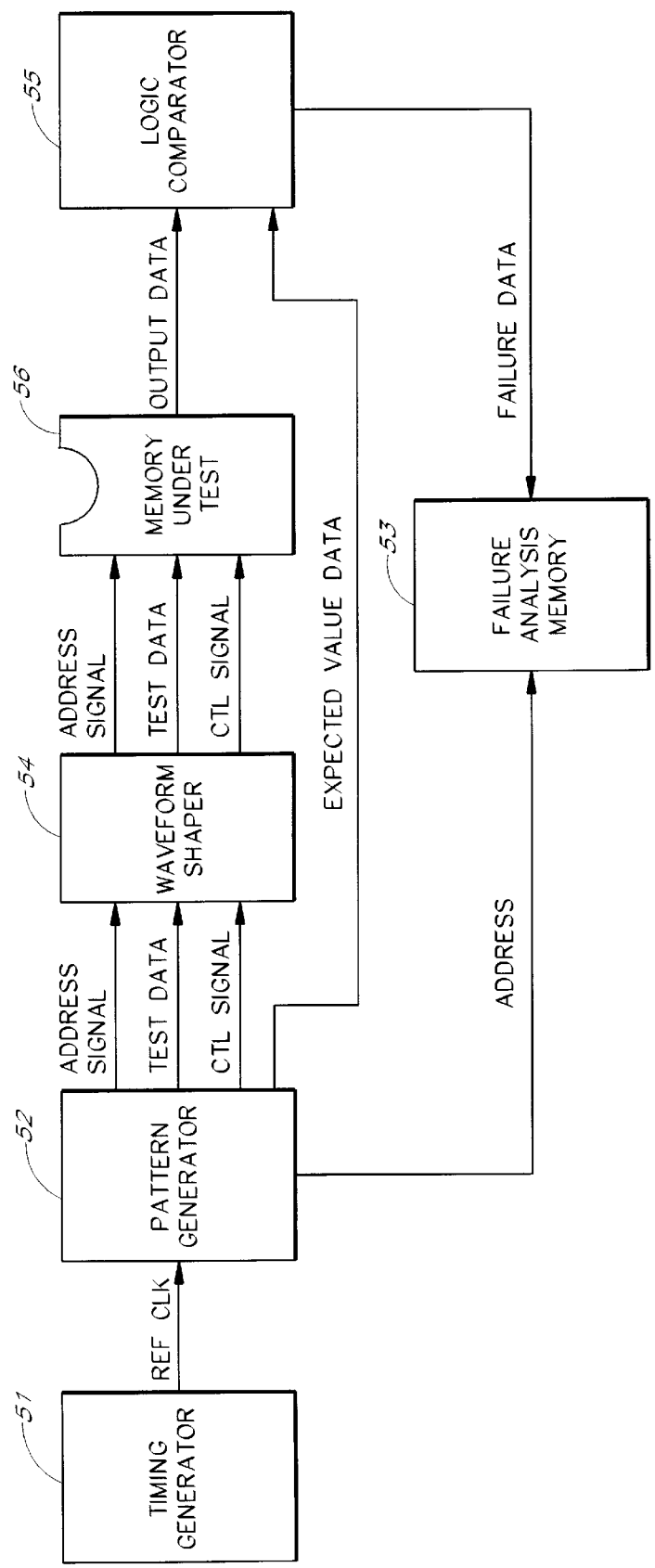
FIG. 1 is a block diagram of a conventional semiconductor memory testing apparatus.
Figure 2:
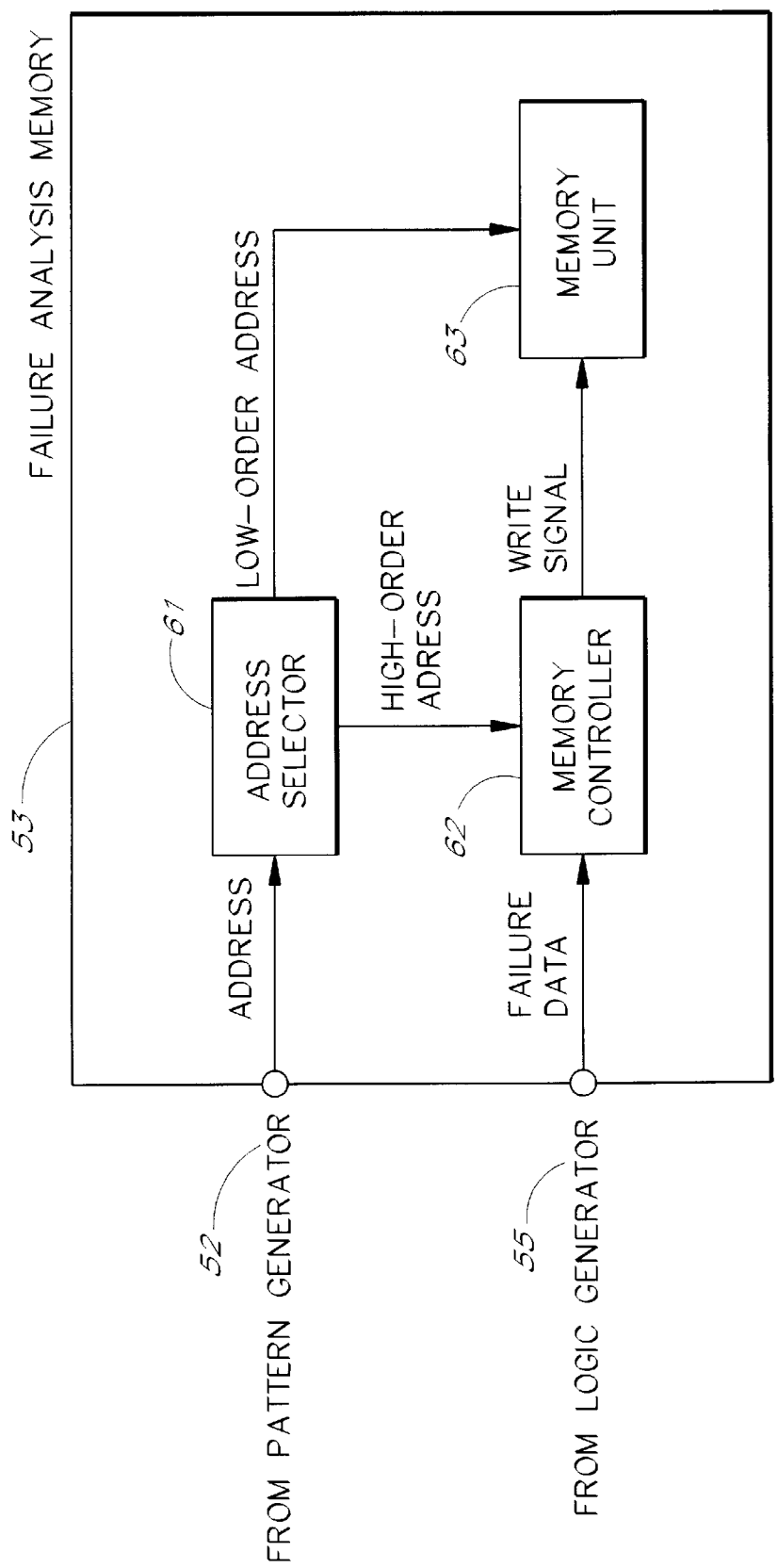
FIG. 2 is a detailed block diagram of a failure analysis memory of the conventional semiconductor memory testing apparatus shown in FIG. 1.
Figure 3:
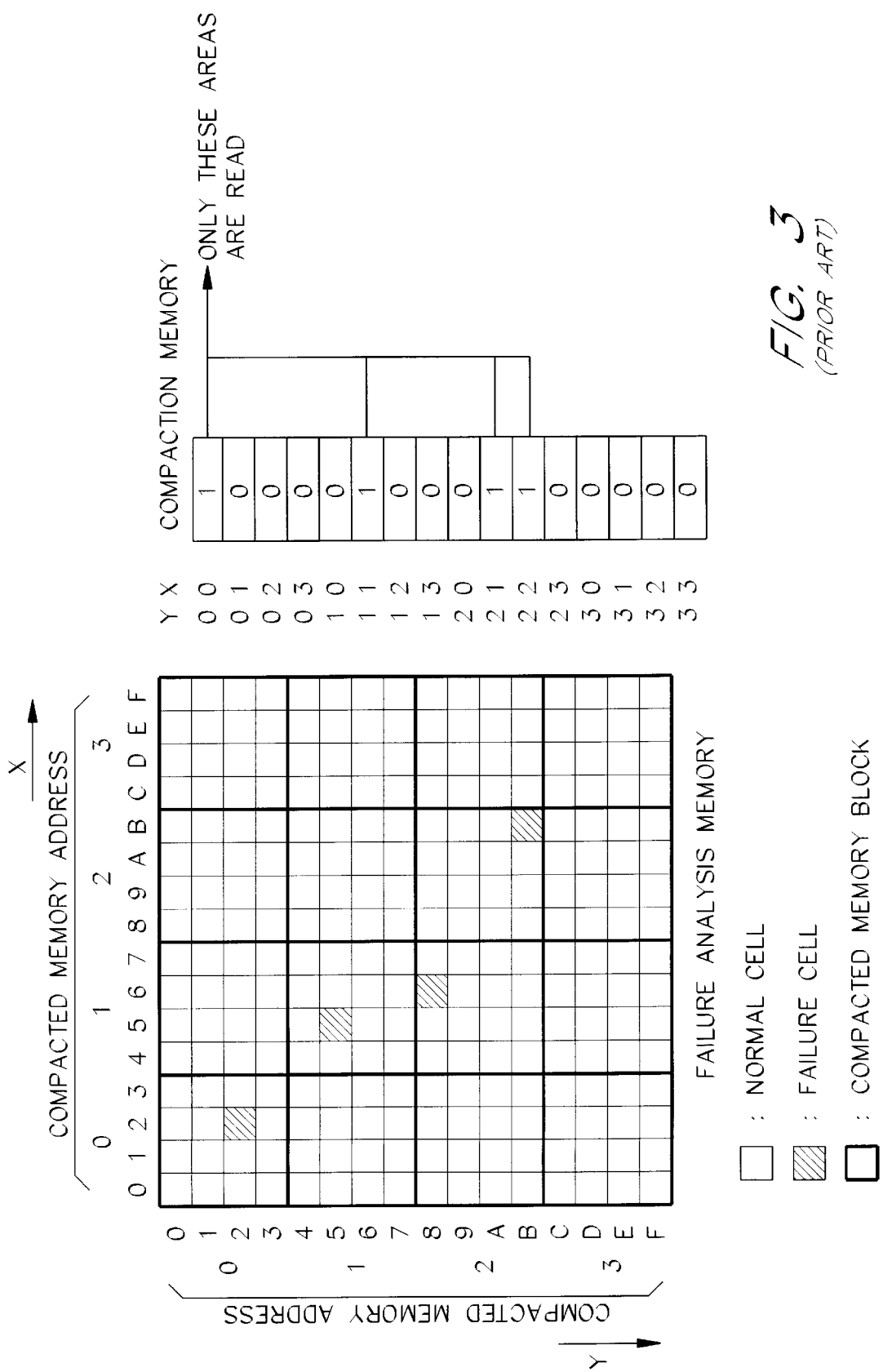
FIG. 3 is a diagram showing an example of data stored in an address-compacted failure analysis memory and a compaction memory.
Figure 4:
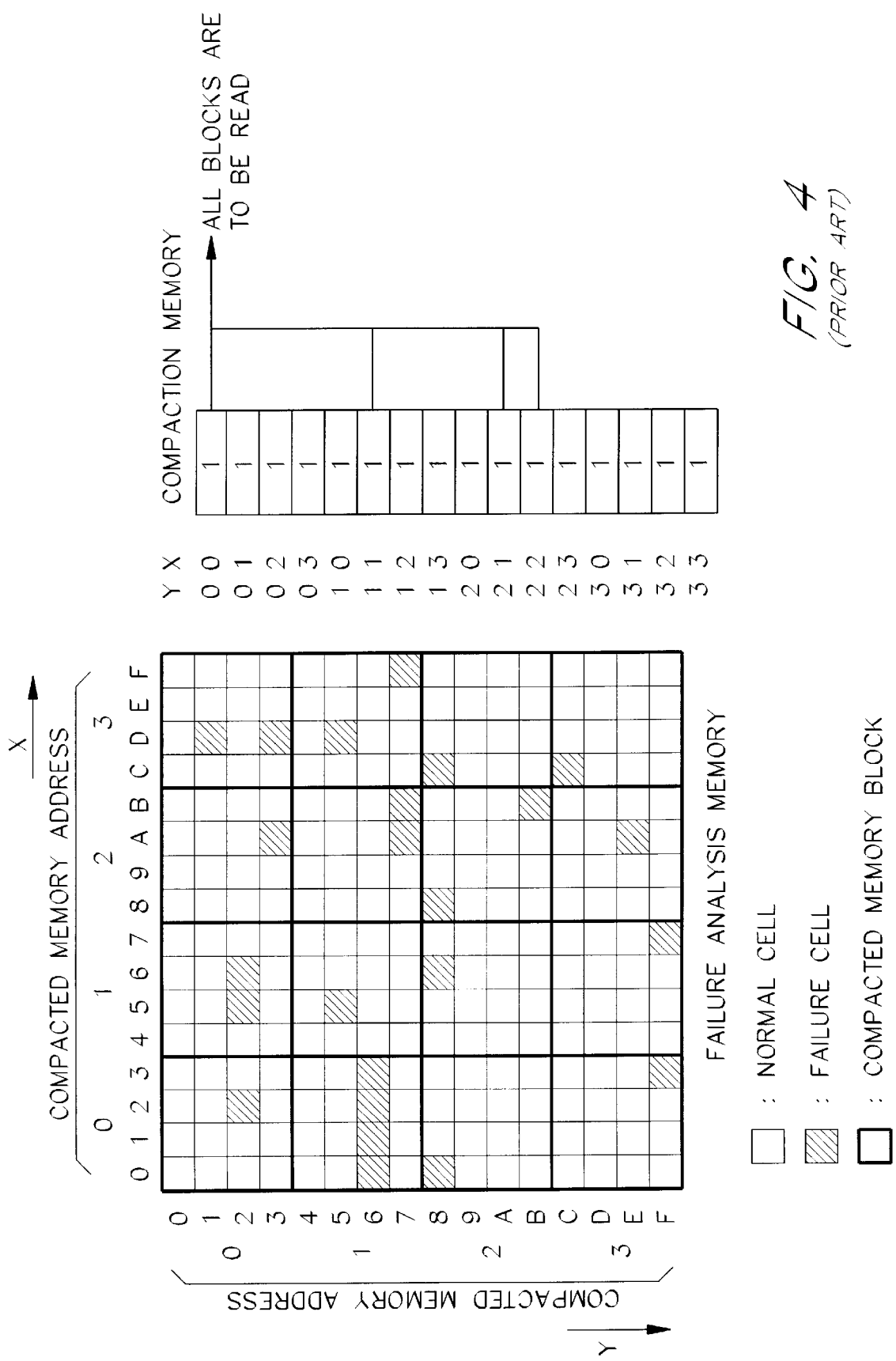
FIG. 4 is a diagram showing another example of data stored in an address-compacted failure analysis memory and a compaction memory.
Figure 5:
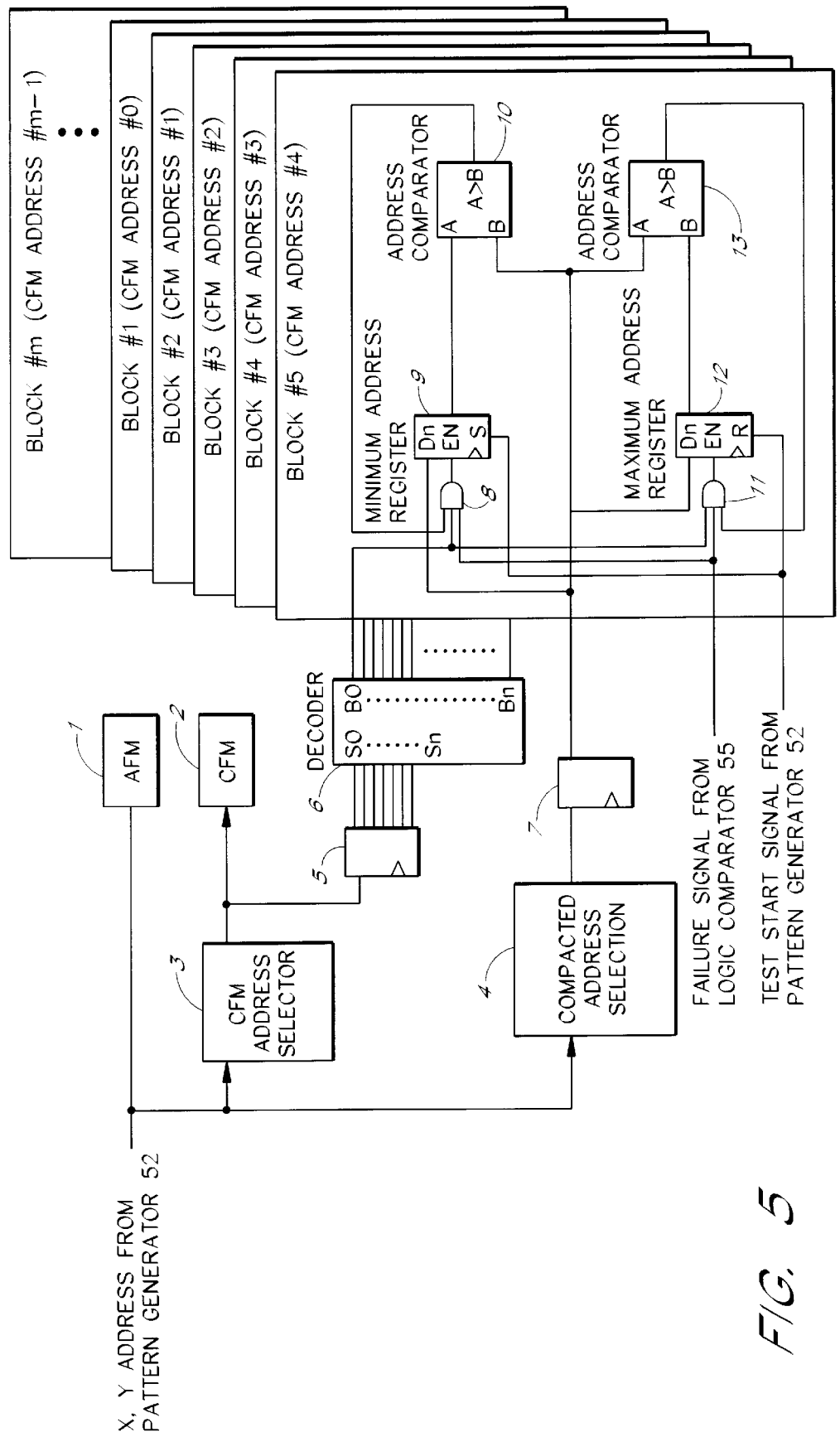
FIG. 5 is a block diagram of a failure analysis memory of a semiconductor memory testing apparatus according to an embodiment of the present invention.

As shown in FIG. 5, a semiconductor memory testing apparatus according to the present invention generally comprises an AFM (Address Failure Memory) 1, a CFM (Compact Failure Memory) 2, a CFM address selector 3, a compacted address selector 4, D flip-flops 5, 7, a decoder 6, AND gates 8, 11, a minimum address register 9, a maximum address register 12, and address comparators 10, 13.

The AFM 1 is a failure analysis memory which has the same storage capacity as a semiconductor memory under test for storing failure data. The AFM 1 is divided into m blocks. The CFM 2 is a compaction memory for storing address-compacted failure data from the AFM 1. The CFM address selector 3 decodes addresses from a pattern generator to select addresses (#0~#m−1) of the CFM 2. The compacted address selector 4 selects compacted addresses of the semiconductor memory under test. Addresses selected by the CFM address selector 3 are latched by the D flip-flop 5, and thereafter decoded by the decoder 6. Addresses selected by the compacted address selector 4 are latched by the D flip-flop 7. The AND gates 8, 11, the minimum address register 9, the maximum address register 12, and the comparators 10, 13 are provided for each of the blocks #1, #2, . . . , #m (the CFM addresses #0, #1, . . . , #m−1) of the CFM 2. After a semiconductor memory test has started, the minimum address register 9 and the maximum address register 12 are set respectively to a maximum compacted address and #0 in response to a test start signal from the pattern generator. When failure data "1" is present in a compacted block, address-compacted failure data is stored in the CFM 2. The compacted address is compared with the minimum and maximum addresses stored respectively in the minimum and maximum address registers 9, 10 by the address comparators 10, 13. If the compacted address is smaller than the minimum address, then the AND gate 8 outputs a signal "1", storing the compacted address in the minimum address register 9. If the compacted address is larger than the maximum address, then the AND gate 11 outputs a signal "1", storing the compacted address in the maximum address register 12. After the semiconductor memory test, a range for reading blocks which contain failure cells (the data read from the CFM 2 is "1") resides between the minimum address stored in the minimum address register 9 and the maximum address stored in the maximum address register 12.

Figure 6:
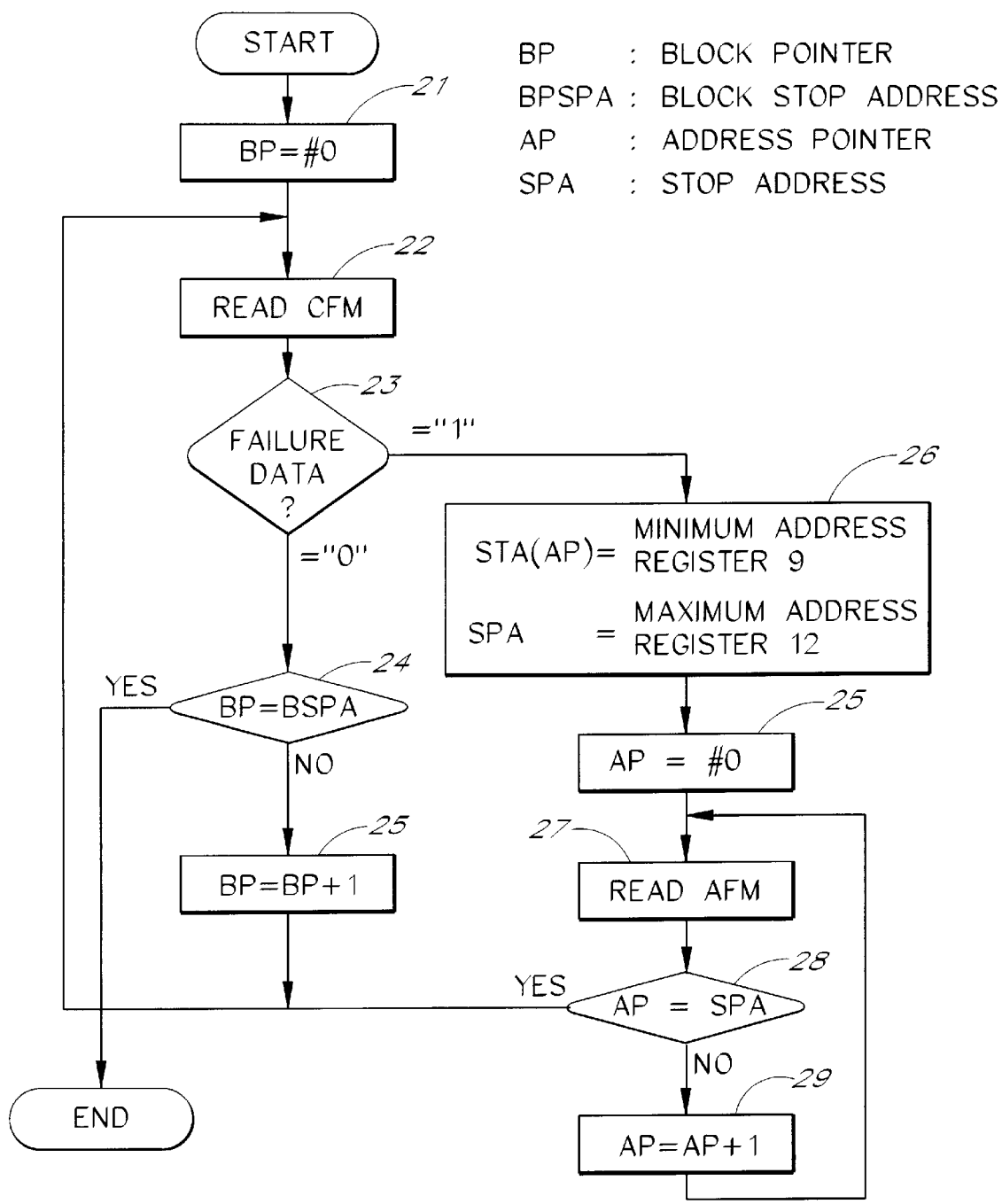
FIG. 6 is a flowchart of a process of reading failure data from an address failure memory in the semiconductor memory testing apparatus shown in FIG. 5.

FIG. 6 is a flowchart of a process of reading stored data from the CFM 2. First, a block pointer BP is set to #0 in a step 21. Then, compacted failure data #1 is read from the CFM 2 in a step 22. It is determined whether the compacted failure data #1 is "1" or "0" in a step 23. If the compacted failure data #1 is "0", then it is determined whether the block pointer BP is a final block address BPSPA or not in a step 24. If the block pointer BP is the final block address BPSPA, then since the process has proceeded to the final block, the process is brought to an end. If not, then the block pointer BP is incremented by "1" in a step 25, and control returns to the step 22. If the compacted failure data #1 is "1" in the step 23, then the minimum and maximum addresses stored respectively in the minimum and maximum address registers 9, 12 of the block indicated by the block pointer BP are loaded respectively into an address pointer AP and a stop address SPA in a step 26. Then, data stored in the AFM 1 is read in a step 27. The value of the address pointer AP is compared with the value of the stop address SPA in a step 28. If the value of the address pointer AP is not equal to the value of the stop address SPA, then the address pointer AP is incremented by "1" in a step 29, after which control goes back to the step 27. If the value of the address pointer AP is equal to the value of the stop address SPA, then control returns to the step 22.

Figure 7:
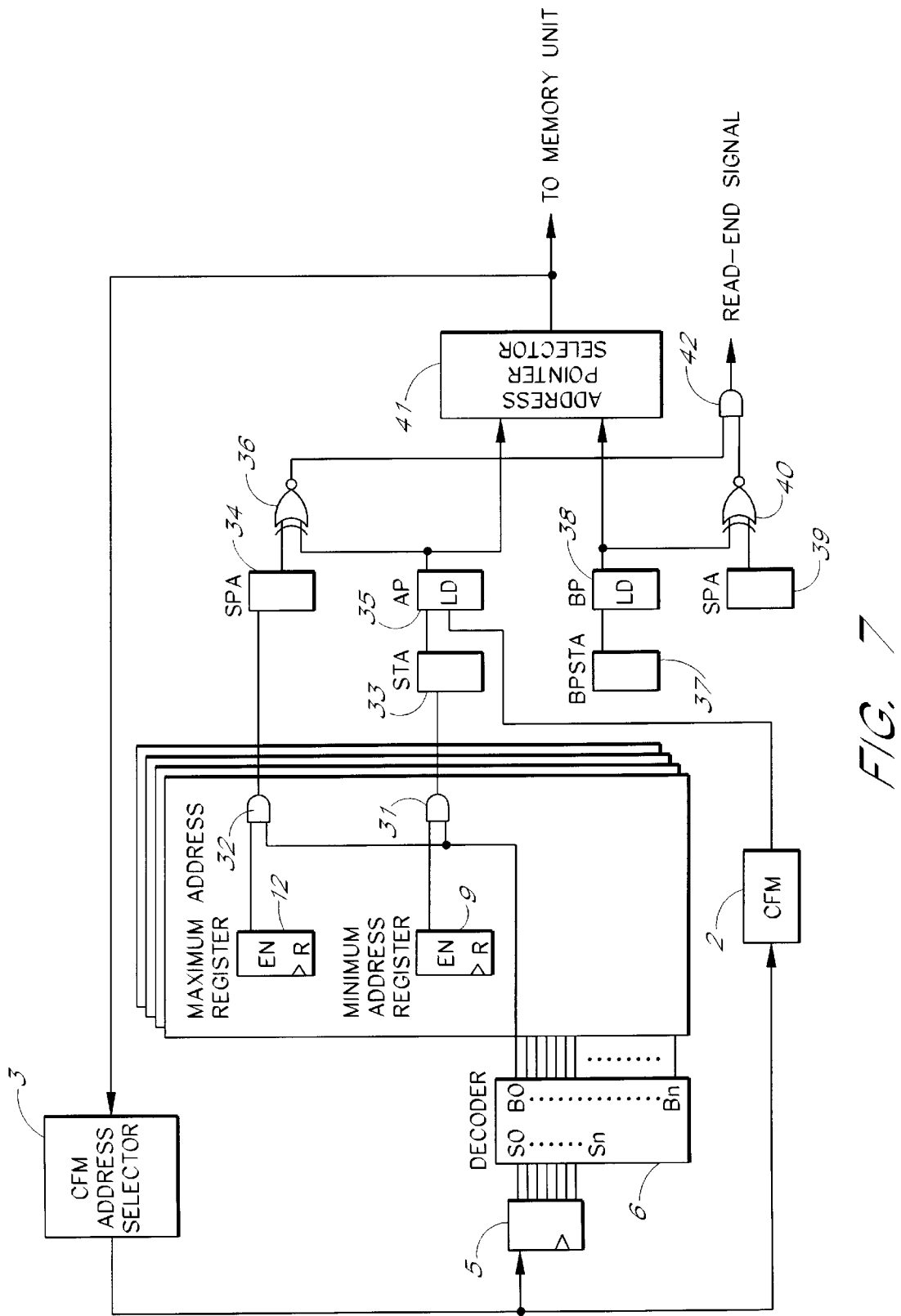
FIG. 7 is a block diagram of a pointer control circuit in the semiconductor memory testing apparatus shown in FIG. 5.

FIG. 7 shows in block form a pointer control circuit in the semiconductor memory testing apparatus shown in FIG. 5. As shown in FIG. 7, when the block is decoded by the decoder 6, the minimum address stored in the minimum address register 9 and the maximum address stored in the maximum address register 12 are supplied through respective AND gates 31, 32 and stored in an STA resister 33 and an SPA register 34, respectively. The minimum address stored in the STA register 33 is loaded into an AP register 35 by a failure signal from the CFM 2. The value of the SPA register 34 and the value of the AP register 35 are inputted to an Exclusive-NOR gate 36. The value of the address pointer AP stored in the AP register 35 is inputted to an address pointer selector 41. A block start address is stored in a BPSTA register 37 and then stored in a BP register 38. A block stop address BPSPA is stored in a BPSPA register 39. The value of the block pointer BP stored in the BP register 38 and the block stop address BPSPA stored in the BPSPA register 39 are inputted to an Exclusive-NOR gate 40. The value of the BP pointer stored in the BP register 38 is inputted to the address pointer selector 41. The address pointer selector 41 selects the address pointer AP from the AP register 35 or the block pointer BP from the BP register 38, and outputs the selected pointer to a memory unit and the CFM address selector 3. An AND gate 42 is supplied with output signals from the Exclusive-NOR gates 36, 40, and outputs a read-end signal indicating that the process of reading the data from the CFM 2 comes to an end when the output signals from the Exclusive-NOR gates 36, 40 are "1".

Figure 8:
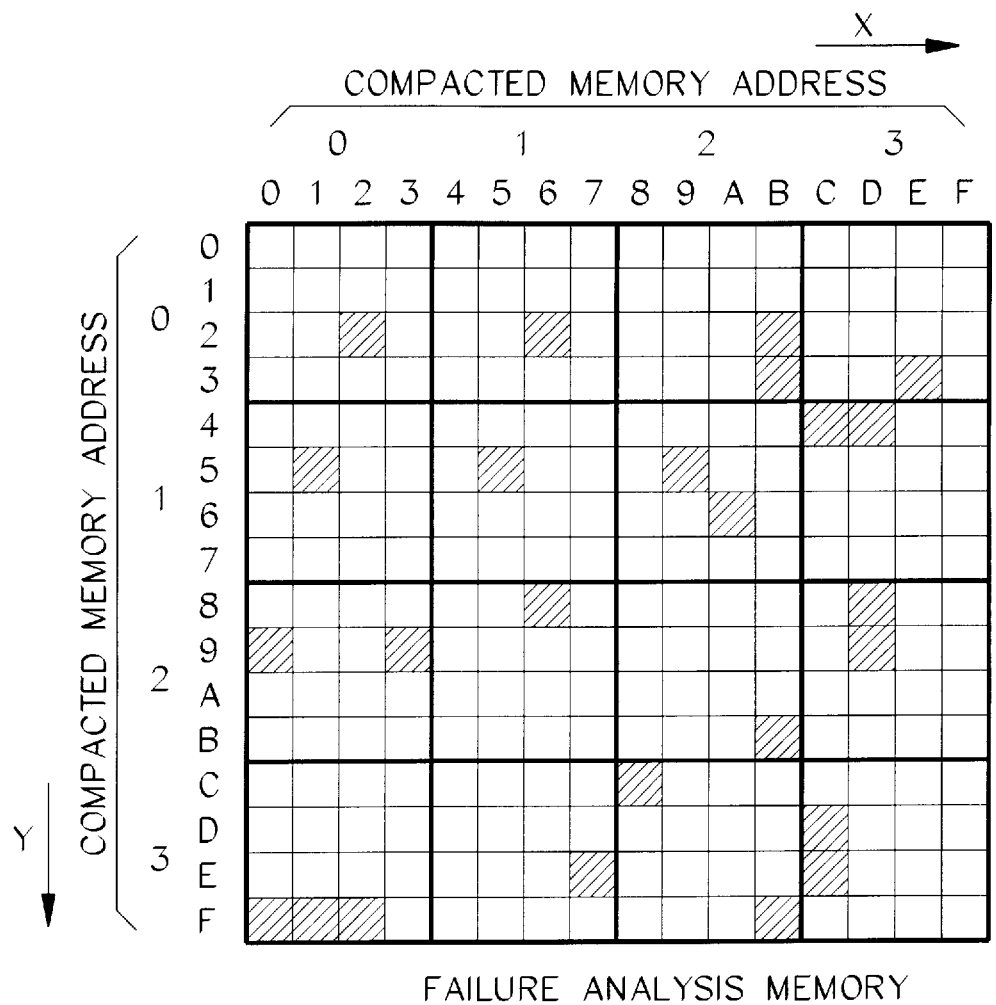
FIG. 8 is a diagram showing an example of failure information in a failure analysis memory.
Figure 9:
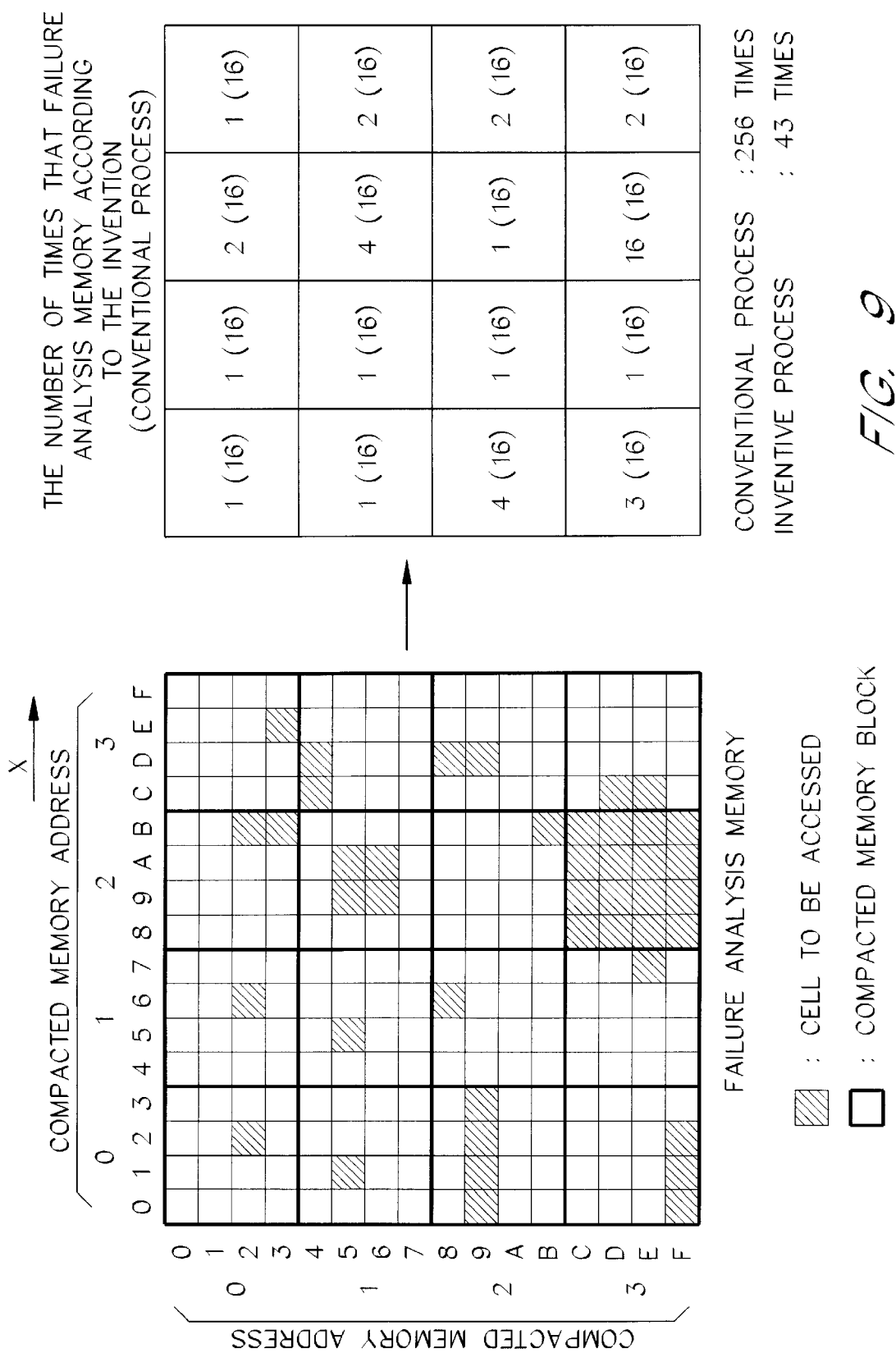
FIG. 9 is a diagram showing the number of times that the failure analysis memory shown in FIG. 8 is accessed when the present invention is applied to the failure analysis memory.

The number of times that a failure analysis memory which stores failure information as shown in FIG. 8 is shown in FIG. 9. According to the conventional process, since all blocks are failure blocks, the compaction memory is accessed 16 times, and the failure analysis memory is accessed 16×16=256 times. According to the present invention, however, the failure analysis memory is accessed 43 times. Therefore, the number of times that the failure analysis memory is accessed according to the present invention is much smaller than the number of times that the failure analysis memory is accessed according to the conventional process. According to the present invention, consequently, the process of reading the failure analysis memory is speeded up.

While a preferred embodiment of the present invention has been described using specific terms, such description is for illustrative purposes only, and it is to be understood that changes and variations may be made without departing from the spirit or scope of the following claims.

What is claimed is:

1. A method of testing a semiconductor memory, comprising the steps of:

dividing a failure analysis memory for storing failure information representative of a test result of a semiconductor memory under test, into a plurality of blocks with compacted addresses;

preparing a compaction memory having areas corresponding respectively to the blocks of the failure analysis memory;

writing data indicative of a failure cell in any one of the blocks of the failure analysis memory, in an area of said compaction memory which corresponds to said any one of the blocks;

determining minimum and maximum addresses of addresses at which failure cells are present in said blocks; and reading failure data from the failure analysis memory in a range between the minimum and maximum addresses of each of the blocks, which correspond to the areas of said compaction memory which store the data indicative of a failure cell.

2. An apparatus for testing a semiconductor memory, comprising:

a failure analysis memory divided into a plurality of blocks with compacted addresses for storing failure information representative of a test result of a semiconductor memory under test;

a compaction memory having areas corresponding respectively to the blocks of the failure analysis memory;

data writing means for writing data indicative of a failure cell in any one of the blocks of the failure analysis memory, in an area of said compaction memory which corresponds to said any one of the blocks;

minimum address storing means and maximum address storing means for storing a minimum address and a maximum address, respectively, of addresses at which failure cells are present in said blocks;

first and second address comparing means for comparing a readout address of each of the blocks of said failure analysis memory with the minimum address stored in said minimum address storing means and the maximum address stored in said maximum address storing means;

means for storing said readout address in the minimum address storing means if said readout address is smaller than said minimum address and failure data of said failure analysis memory at said readout address represents a failure address;

means for storing said readout address in the maximum address storing means if said readout address is greater than said maximum address and failure data of said failure analysis memory at said readout address represents a failure address; and means for reading failure data from said failure analysis memory in a range between the minimum and maximum addresses of each of the blocks, which are stored in the minimum and maximum address storing means.

3. An apparatus according to claim 2, wherein each of said minimum address storing means and said maximum address storing means comprises a register.

* * * * *